United States Patent
Ivey et al.

(10) Patent No.: US 9,046,874 B2
(45) Date of Patent: Jun. 2, 2015

(54) EXPOSURE APPARATUS AND METHODS

(75) Inventors: Peter Anthony Ivey, Hope Valley (GB); Richard Peter McWilliam, Durham (GB); Alan Purvis, Durham (GB); Gavin Lewis Williams, Sheffield (GB); Nicholas Luke Seed, Sheffield (GB); Richard Ian Curry, Durham (GB); Jose Juan De Jesus Toriz-Garcia, Sheffield (GB)

(73) Assignees: University of Durham, Durham (GB); University of Sheffield, Sheffield (GB)

( * ) Notice: Subject to any disclaimer, the term of this patent is extended or adjusted under 35 U.S.C. 154(b) by 1131 days.

(21) Appl. No.: 13/056,023

(22) PCT Filed: Jul. 30, 2009

(86) PCT No.: PCT/GB2009/050945
§ 371 (c)(1), (2), (4) Date: May 6, 2011

(87) PCT Pub. No.: WO2010/013052
PCT Pub. Date: Feb. 4, 2010

(65) Prior Publication Data
US 2011/0292363 A1 Dec. 1, 2011

(30) Foreign Application Priority Data

Jul. 30, 2008 (GB) .................................. 0813907.3

(51) Int. Cl.
*G03B 27/32* (2006.01)
*G03B 27/52* (2006.01)
(Continued)

(52) U.S. Cl.
CPC .............. *G03H 1/08* (2013.01); *G03F 7/70408* (2013.01); *G03F 7/70291* (2013.01);
(Continued)

(58) Field of Classification Search
CPC ..... G03F 1/0007; G03F 1/144; G03F 7/0037; G03F 7/24; G03F 7/7015; G03F 7/70158; G03F 7/70283; G03F 7/70291; G03F 7/703; G03F 7/70308; G03F 7/70316; G03F 7/70408; G03F 7/70416; G03F 7/70508; G03H 1/0005; G03H 1/08; G03H 1/0443; G03H 1/22; G03H 1/2294; G03H 2001/005; G03H 2001/0088; G03H 2001/0094; G03H 2001/2221; G03H 2001/264; G03H 2001/32; G03H 2001/0038
USPC .......................... 355/55, 67, 71, 77; 430/5, 30
See application file for complete search history.

(56) References Cited

U.S. PATENT DOCUMENTS 6,304,316 B1 10/2001 Jain et al.
7,095,484 B1 8/2006 Fries
(Continued)

OTHER PUBLICATIONS

Eisner, Klaus, "International Search Report", for PCT/GB2009/050945 as mailed Feb. 11, 2010, 4 pages.
(Continued)

*Primary Examiner* — Colin Kreutzer
(74) *Attorney, Agent, or Firm* — Winstead PC

(57) ABSTRACT

A light beam collimated by illumination optics (4) from a radiation source (6) illuminates the surface of a wave front modulator (8) such as an Spatial Light Modulator (SLM) or Computer Generated Hologram photomask (CGH). The resulting wave travels via projection optics (10) to the substrate (12), passing through a projection lens assembly (14). The SLM (8) is programmed or CGH configured with a modulation pattern that is determined by the substrate (12) topography and desired pattern. The substrate topography is provided by Digital Holography (DH) surface profilometery performed by a DH microscope (18), which provides geometrical or topographical input to the CGH calculation routines (16). An arrangement for vertical or sloping surface patterning has a grating (22) superimposed onto the CGH pattern (24) to generate +1 and −1 orders. The SLM or CGH may be configured: using Fresnel patterns to provide an extended depth of field of the projected wave front; by encoding line segments of the desired pattern as cylindrical lines; by calculating inverse propagation between non-planar topography of the substrate and the SLM or CGH (using a Rayleigh-Sommerfield diffraction formula); and/or using iteration to determine a restricted encoding in the configuration of the SLM or CGH.

25 Claims, 3 Drawing Sheets

(51) Int. Cl.
| | |
|---|---|
| *G03B 27/54* | (2006.01) |
| *G03B 27/72* | (2006.01) |
| *G03F 1/00* | (2012.01) |
| *G03H 1/08* | (2006.01) |
| *G03F 7/20* | (2006.01) |
| *G03H 1/00* | (2006.01) |
| G03H 1/04 | (2006.01) |
| G03H 1/22 | (2006.01) |
| G03H 1/26 | (2006.01) |

(52) U.S. Cl.
CPC ........... *G03F 7/70158* (2013.01); *G03F 7/703* (2013.01); *G03F 7/70416* (2013.01); *G03H 1/0005* (2013.01); *G03H 1/0443* (2013.01); *G03H 1/22* (2013.01); *G03H 1/2294* (2013.01); *G03H 2001/0038* (2013.01); *G03H 2001/005* (2013.01); *G03H 2001/0088* (2013.01); *G03H 2001/0094* (2013.01); *G03H 2001/2221* (2013.01); *G03H 2001/264* (2013.01); *G03H 2225/32* (2013.01)

(56) References Cited

U.S. PATENT DOCUMENTS

2006/0209370 A1* 9/2006 Coppola et al. .................. 359/9
2008/0094674 A1 4/2008 Purvis et al.
2008/0265130 A1* 10/2008 Colomb et al. ............ 250/201.9

OTHER PUBLICATIONS

Moore, G., "Cramming more components onto integrated circuits", Electronics 38 (8) 82-85 (1965).
Bühling, S, et al., "Resolution enhanced proximity printing by phase and amplitude modulating masks", J. Micromech, Microeng, 11, 2001, pp. 603-611.
Neto, L.G., et al., "Design, fabrication and characterization of a full complex-amplitude modulation diffractive optical element" SPIE J. Micro/Nanolithography, MEMS and MOEMS 2 96-104 (2003).
Borodovsky, Y., et al., "Pixelated phase masks as novel lithography RET", Proc. SPIE 6924 69240E (2008), 14 pages.
Nellissen, T., et al., "A novel photolithographic method for realising 3-d interconnection patterns on electronic modules", 14th European Microelectronics and Packaging Conference & Exhibition, Friedrichshafen, Germany, Jun. 23-25, 2003, 347-351.
Frère, C., et al., "Computer-generated holograms of three-dimensional objects composed of line segments", J. Opt. Soc. Am., 3(5), May 1986, pp. 726-730.
Fischer, K., et al., "Spray coating—a solution for resist film deposition across severe topography", IEEE EMT Symposium 338-341 (2004).
Tommasi, T., et al., "Computer-generated holograms of tilited planes by a spatial frequency approach", J. Opt. Soc. Am. A. 10(2), Feb. 1993, pp. 299-305.
Fienup, J.R., et al., "Phase retrieval algorithms: a comparison", Appl. Opt. 21(15), Aug. 1, 1982, pp. 2758-2769.
Eismann, M.T., et al., "Iterative design of a holographic beamformer", Appl. Opt. 28(13), Jul. 1, 1989, pp. 2641-2650.
Sinclair, G., et al., "Interactive application in holgraphic optical tweezers of a multiple-plane Gerchberg-Saxton algorithm for three-dimensional light shaping", Opt. Express 12(8), Apr. 2004,1665-1670.
Sanford, J.L., et al., "A one-megapixel reflective spatial light modulator system for holographic storage", IBM J. R&D 42 (3-4), May/Jul. 1998, pp. 411-426.
Shen, F., et al., "Fast-Fourier-transform based numerical integration method for the Rayleigh-Sommerfeld diffraction formula", Appl. Opt. 45(6), Feb. 20, 2006, 1102-1110.
Clube, F., et al., "Large-field, high-resolution photolithography", SPIE 3099, 36-45 (1997).
Maiden, A., et al., "Non-planar photolithography with computer generated holograms", Optics Letters vol. 30, No. 11, Jun. 1, 2005, 1300-1302.
Remènyi, J., et al., "Amplitude, phase, and hybrid ternary modulation modes of a twisted-nematic liquid-crystal display at -400 nm", Appl. opt. 42(17), Jun. 10, 2003, pp. 3428-3434.
Rosen, J., "Computer-generated holograms of images reconstructed on curved surfaces", Appl. Opt. 38(29), Oct. 10, 1999, pp. 6136-6140.
Poon, T., et al., "Digital holography and 3D imaging: introduction to the feature issue", Appl. Opt. 47(19), Jul. 1, 2008, 1 page.
Born, M., et al. "Elements of the Theory of Diffraction", Chapter VIII, "Principles of Optics", 6th Ed., Pergamon Press, Oxford (1980), pp. 370-458.
Wong, a., et al., "Modified Illumination", Chapter 3, Resolution Enhancement Techniques in optical lithography, SPIE press, WA (2001), pp. 71-90.
Wong, A., et al., "Optical Proximity Correction", Chapter 4, Resolution Enhancement Techniques in optical lithography, SPIE press, WA (2001), pp. 91-115.
Williams, Gavin L., et al., "A photolithographic process for grossly non-planar substrates", Emerging Lithographic Technologies XII, Proc. of SPIE, vol. 6921, 2008, pp. 69212E1-69212E9, XP-002562738.

* cited by examiner

EXPOSURE APPARATUS AND METHODS

The present invention relates to deposition of electronic structures on top of non-planar surfaces at or below the 1 μm scale but is not restricted to the 1 μm scale. The application base encompasses many 3d electronic device packaging areas such as MEMS (Micro-Electro-Mechanical Systems) devices (e.g. accelerometers), micro-passives (e.g. inductors), chip to chip vertical interconnect (i.e. vias), sensors (e.g. bio-electrode arrays for the study of neurons) and active arrays (e.g. bio-arrays for culture studies). These applications have a common need for non-planar conductive structures to be deposited on the surface of the device for numerous reasons such as compactness, wiring density or to fabricate novel spatial sensor/excitation pad arrangements.

Five out of sixteen professional development courses at the 2008 IEEE Electronic Components and Technology Conference (ECTC08) were concerned with various aspects of three dimensional packaging of microelectronics, indicating its current importance to the microelectronics industry. In the field of MEMS the current inability to perform lithography on non-planar substrates places large restrictions both on the patterning of electrical routing and on the bulk etching of the substrate. 3d substrate patterning is therefore ready for development towards sub-micron scale.

The field of digital holography is itself experiencing a resurgence of interest due to rapid developments in holographic applications such as data storage and 3d microscopy for the Life Sciences. This is exemplified by the increasing number of publications in the area including as a recent special issue on digital holography in 3d imaging published in Applied Optics [Poon]. Particularly active areas include the computation of CGHs (Computer Generated Holograms) of 3d object surfaces and the novel application of SLMs to achieve precise pattern registration and efficient modulation using UV illumination.

The proposed applications for 3d technology are in the areas of microelectronics, MEMS and bio-MEMS. For example, bio-electronic systems, miniature RF antennas and microfluidic systems. The ability to pattern electrical interconnects and electrodes on 3d substrates has direct relevance to the development of novel bio-analysis instrumentation for academic research and the healthcare industry whereby 3d interconnection and electrode patterning could facilitate the fabrication of user-defined structures beyond the conventional planar arrays for application specific 3D culture studies. This technology could also be used in the manufacture of 3D bio-sensors.

In conventional lithography patterns are transferred to a layer of photosensitive material residing on a substrate using a photomask which is arranged either in close proximity with the substrate or placed above a projection lens assembly such that, when illuminated by light of a suitable wavelength, the pattern appears focused onto the photoresist. The resolution of this technique is governed by diffraction which dictates either that the photomask is placed very close, or even in hard contact with the substrate, or else that the substrate lies precisely in the focal plane of the projection lens system. If this is not adhered to, blurring of the pattern will occur. These restrictions have precluded the direct use of non-planar, 3d, shaped substrates since the conventional photomask is unable to maintain focusing of the pattern. As a first step towards compensation for diffraction effects, pre-distortions to the photomask pattern have been applied using various techniques generally referred to as Optical Proximity Correction (OPC) [Wong]. Through the application of further Resolution Enhancement Techniques (RET) such as modified illumination and phase-shifting photomasks, the focusing properties of both the photomask and exposure system are improved. These techniques have been developed specifically for proximity and projection lithography over planar substrates.

A fully diffraction compensated photomask requires proper calculation of the object wave front. Such photomasks are a member of the family of Computer Generated Holograms (CGH) and perform the necessary wavefront modulation to achieve the correct image focus. This approach gained interest in proximity lithography to the observed de-blurring of images projected using large exposure gaps. Wyrowski et al reported a proximity printing method [Bühling] based on the use of phase and amplitude masks for planar photolithography. This approach employed an error reduction algorithm to produce a CGH solution suitable for fabrication as a 2-level amplitude and 4-phase level mask. Design "freedom" was used to define latitude in terms of phase and amplitude values in the final image. A 1 micron pitch CGH and 50 micron exposure gap was used to create 3 micron line-space patterns over a flat substrate. Neto et al employed a similar strategy [Neto] to compensate for diffraction effects again with a 50 micron gap. They implemented a slightly more intricate 4-level phase and pseudo-grayscale CGH coding scheme, this time using 3 micron pixels and no iteration to generate a claimed resolution better than 1 micron over planar substrates.

Philips devised a non-CGH based method for lithography over vertical side walls [Nelissen] which employed phase diffraction gratings placed on top of a conventional photomask. Careful optimisation of the grating results in suppression of the zero order and direction of the photomask pattern along the +1 and −1 orders of the grating. The pattern is therefore transferred to vertical substrate side walls. Although some distortion occurs due to the angular incidence of the impinging image, this is not noticeable in the case when the pattern consists of 1d vertical features and when the pattern features are coarse. For fine pitch features and 2d patterns angular distortion will become apparent. However more critical will be overall blurring of the image due to diffraction which will worsen as the vertical wall depth increases and/or as the feature size reduces.

TIR holography has been used in large area sub-micron planar lithography and uses an optical method to record the intensity interference pattern produced between an object and reference wave. Being an optical process there is considerable complexity in the recording and reconstruction process, requiring an elaborate optical set up to ensure accurate reconstruction of the pattern.

Zone plate lithography (ZPL) is used to project planar sub-micron patterns. This is a closely related technology within the realms of sub-micron patterning but it can not be used to pattern 3d substrates because it is not possible to fabricate electronically controllable zone plate arrays with sufficient fidelity.

Keeping up with Moore's Law is an increasingly difficult and expensive technological challenge. In order to sustain the ever growing complexity and the ever shrinking size of electronic systems, three dimensional packages are becoming increasingly popular. These packages require fine pitch electrical routing between the layers of silicon. Similarly, inherently three dimensional MEMS, MOEMS and microfluidic devices often require electrical routing over and between their surfaces. Currently this non-planar routing is not achieved lithographically. Instead, a variety of direct-write methods are used, thus precluding a faster method for mass production and also the development of entirely new routing strategies.

The need to further miniaturise this technology and demonstrate sub-micron pitch tracks on uneven surfaces has been identified as an essential driver. Working below 1 µm presents significant new challenges: efficient mask computation and manufacture, mask-to-substrate alignment, illumination optics and photoresist application.

The current (analytical) method of calculating the phase and amplitude CGHs for non-planar lithographic patterns is based on the computation of line segments (LS) [Frere]. A number of other groups have done work in this area, but note that their solutions are restricted to a single plane. Their methods are based on iterative algorithms that determine a restricted encoding that reproduces the desired pattern. Wyrowski and co-workers [Bühling] have demonstrated 3 µm track and gap proximity-printing on a planar substrate with an exposure gap of 50 µm. This has been enhanced by the manufacture of full complex-amplitude modulation masks [Neto]. Intel have used masks with sub-wavelength sized pixels to pattern memory devices by projection lithography [Borodovsky]. In a separate project [Nellisen], diffraction gratings have been used to redirect mask patterns onto the vertical side walls of semiconductor packages without the need for off-axis illumination, but encountered poor resolution due to diffractive line broadening.

The term CGH may be used to refer to Computer Generated Holography or Computer Generated Holograms.

The apparatus of the present invention in its most general form comprises a wave front control means configured to alter a wave front of radiation, a projection means for projecting the altered radiation, and configuration means for configuring the wave front control means based on a substrate topography.

The method of the present invention in its most general form comprises the steps of altering a wave front of radiation, configuring the alteration based on a substrate topography, and projecting the altered radiation onto a substrate comprising a radiation sensitive resist.

In accordance with a first aspect of the present invention, there is provided an exposure apparatus for projecting radiation corresponding to a pattern onto a substrate, the exposure apparatus comprising:
  a wave front control means configured to alter a wave front of the radiation;
  configuration means for configuring the wave front control means based on the pattern and a topography of the substrate; and
  a projection means for projecting the altered wave front onto a substrate.

Preferably, the configuration means is operable to configure the wave front control means using Fresnel patterns to provide an extended depth of field of the projected altered wave front.

Preferably, the configuration means is operable to configure the wave front control means by encoding line segments of the pattern as cylindrical lines.

Preferably, the projection means comprises a phase grating arranged with the wave front control means to transform the focal plane of the altered wave front for projection on to a vertical or sloping side wall of the substrate.

Preferably, the phase grating is curved to transform the focal plane of the altered wave front for projection on to the inside of a curved hole of the substrate.

Preferably, the configuration means is operable to configure the wave front control means by calculating inverse propagation between non-planar topography of the substrate and the wave front control means.

Preferably, the configuration means is operable to calculate the inverse propagation using a Rayleigh-Sommerfield diffraction formula.

Preferably, the configuration means is operable to calculate the inverse propagation using iteration to determine a restricted encoding in the configuration of the wave front control means.

Preferably, the exposure apparatus further comprises a radiation source means for providing the wave front configuration means with partially coherent radiation to be altered.

Preferably, the exposure apparatus further comprises a substrate profiling means for determining the topography of the substrate.

Preferably, the substrate profiling means comprises a digital holography inspection apparatus.

In accordance with a second aspect of the present invention, there is provided a method of projecting radiation corresponding to a pattern onto a substrate, the method comprising the steps:
  altering a wave front of the radiation;
  configuring the altering based on the pattern and a topography of the substrate; and
  projecting the altered wave front onto a substrate.

Preferably, the step of configuring uses Fresnel patterns to provide an extended depth of field of the projected altered wave front.

Preferably, the step of configuring comprises encoding line segments of the pattern as cylindrical lines.

Preferably, the step of projecting comprises using a phase grating to transform the focal plane of the altered wave front for projection on to a vertical or sloping side wall of the substrate.

Preferably, the phase grating is curved to transform the focal plane of the altered wave front for projection on to the inside of a curved hole of the substrate.

Preferably, the step of configuring comprises calculating inverse propagation between non-planar topography of the substrate and a wave front control means used to perform the step of altering.

Preferably, the step of calculating the inverse propagation comprises using a Rayleigh-Sommerfield diffraction formula.

Preferably, the step of calculating the inverse propagation comprises using iteration to determine a restricted encoding in the step of configuring.

Preferably, the method further comprises the step of providing the step of altering with partially coherent radiation to be altered.

Preferably, the method further comprises the step of determining the topography of the substrate.

Preferably, the step of determining the topography of the substrate comprises using digital holography inspection.

In accordance with a third aspect of the present invention, there is provided a reticle for use in projecting radiation corresponding to a pattern onto a substrate, the reticle comprising a wave front control means configured to alter a wave front of the radiation based on the pattern and a topography of the substrate.

In accordance with a fourth aspect of the present invention, there is provided an exposure apparatus for projecting radiation corresponding to a pattern onto a substrate, the exposure apparatus comprising:
  a wave front control means configured to alter a wave front of the radiation;
  a projection means for projecting the altered radiation onto a substrate; and configuration means for configuring the wave front control means using Fresnel patterns to provide an extended depth of field of the projected altered wave front.

In accordance with a fifth aspect of the present invention, there is provided a method of projecting radiation corresponding to a pattern onto a substrate, the method comprising the steps:

altering a wave front of the radiation;

projecting the altered radiation onto a substrate; and configuring the altering using Fresnel patterns to provide an extended depth of field of the projected altered wave front.

In accordance with a sixth aspect of the present invention, there is provided a reticle for use in projecting radiation corresponding to a pattern onto a substrate, the reticle comprising a wave front control means configured to alter a wave front of the radiation using Fresnel patterns to provide an extended depth of field of the projected altered wave front.

In accordance with a seventh aspect of the present invention, there is provided an exposure apparatus for projecting radiation corresponding to a pattern onto a substrate, the exposure apparatus comprising:

a wave front control means configured to alter a wave front of the radiation;

a projection means for projecting the altered radiation onto a substrate; and configuration means for configuring the wave front control means by encoding line segments as cylindrical lines to provide an extended depth of field of the projected altered wave front.

In accordance with a eighth aspect of the present invention, there is provided a method of projecting radiation corresponding to a pattern onto a substrate, the method comprising the steps:

altering a wave front of the radiation;

projecting the altered radiation onto a substrate; and configuring the altering by encoding line segments as cylindrical lines to provide an extended depth of field of the projected altered wave front.

In accordance with a ninth aspect of the present invention, there is provided a reticle for use in projecting radiation corresponding to a pattern onto a substrate, the reticle comprising a wave front control means configured to alter a wave front of the radiation by encoding line segments as cylindrical lines to provide an extended depth of field of the projected altered wave front.

The present invention will be described by way of example only with reference to the figures in which.

Embodiments of the present invention seek to address the need for achieving the projection of focused fine-pitch patterns over defined 3d surfaces and vertical or sloping side walls by a single exposure at the sub-micron scale. Features of embodiments of the present invention may include:

1. Projection of 3d surface-focused images using either coherent illumination or light with limited spatial coherence such that the pattern remains sharply in focus over the extent of the surface. Partial coherence may be used to reduce speckle.

2. Extended DOF lines using fresnel CGH patterns by using projection or proximity exposure. The use of a (possibly large) proximity gap between substrate and mask alters the DOF properties, but does not limit the resolvable line width.

Figure 2:
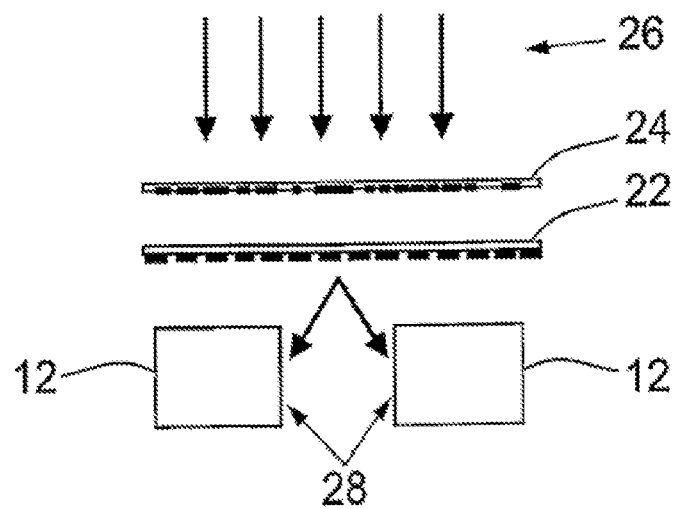
FIG. 2 illustrates a vertical patterning arrangement.

3. With reference to FIG. 2, the combination of a phase grating 22 with a CGH 24 illuminated with radiation 26 to project focused patterns on vertical or sloping side walls 28 of the substrate 12, making possible much larger depth of field.

3a. The use of curved gratings to project patterns on the inside of cylindrical or other curved holes.

4. Reduce demands of alignment accuracy in the z-direction (as orientated along the optical axis) by the use of patterns having extended DOF. This has ramifications for both planar and 3d surfaces.

4a. In the planar substrate scenario there is potential to reduce the extremely demanding alignment accuracy and tolerance demands of process control at sub-micron feature sizes.

4b. For 3d substrates this capability eases the burden of a) alignment precision in z-direction b) removal of off-axis tilt errors c) the need for precise measurement of the surface topography d) the need to deposit entirely uniform layers of photoresist.

5. A system whereby the DOF has been tailored for a given 3d substrate such that the aforementioned burdens described in 4 above are balanced with the image requirements (minimum line width, line profile and coherence set up of illumination).

6. Methods for the deposition of very thin layers of photoresist over grossly non-planar surfaces.

7. DH (Digital Holography) related inspection techniques such as use of DH recorded holograms of the substrate may be combined with representations of the desired image pattern to derive a CGH unique to each respective object.

8. A scanning embodiment of 7 such that the object is scanned (for example in 1d), a CGH is computed in real-time and exposure of the pattern immediately follows in synchronicity.

9. Methods for computing the CGH for 3d patterning using both proximity and projection exposure arrangements.

9a. Use of width and length-controlled line segments with modified implementations for projection by phase or amplitude SLMs.

9b. Direct inverse propagation between the pattern superimposed on the 3d surface and the (planar) CGH. This results in a direct transform between the two surfaces and as such enables restrictions to the CGH encoding (e.g. a phase only modulation) and reinforcement of the object intensity distribution to be applied directly in a series of iteration cycles. This process may be applied as a series of planar slices or tiled segments from which the 3d object pattern is represented, but they rely on a 'rippling' of the constraints between each slice or segment before returning to the CGH plane. Two possible aspects to this approach are: Firstly, the application of well-known optical propagation formulae such as the Rayleigh-Sommerfeld diffraction formula to non-planar surfaces. This kind of generalised approach is computationally intensive but is free from planar restrictions of faster methods such as those based on Fresnel Diffraction Formula (FDF) and Angular Spectrum (AS) representations. Secondly, the addition of iterative techniques to apply restriction to the CGH and object surfaces. These are described further below.

Figure 1:
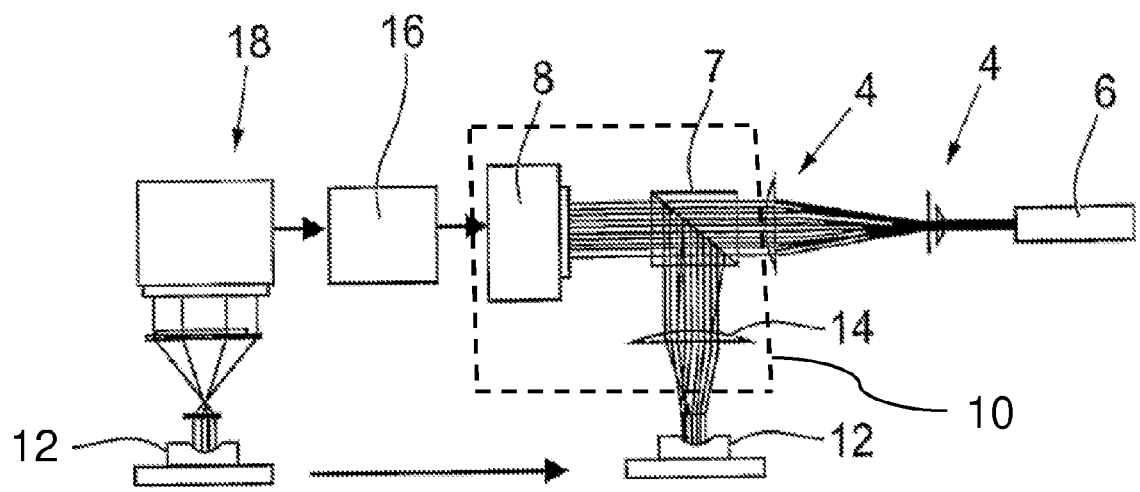
FIG. 1 illustrates an embodiment of a 3d projection lithography system.

1. With reference to FIG. 1, the optical system arrangement 2 utilises a UV beam collimated by illumination optics 4 from a radiation source 6 such as a suitably prepared UV laser arc lamp source to illuminate, via an optical element 7, the surface of the wave front control means 8 that is in this example a wave front modulator such as an SLM or CGH photomask which performs wave front modulation. The resulting wave travels via a projection means 10 to the substrate 12, possibly passing through a projection lens assembly 14, otherwise by free space propagation. The SLM 8 is programmed, by a configuration means 16, with a modulation pattern that is determined by the substrate 12 geometry or topography and desired pattern. The substrate geometry or topography is provided by DH surface pro-filometery performed by a DH microscope 18, which provides geometrical or topographical input to the CGH calculation routines 16. The topography may be measured with the bare substrate before resist is coated or after resist coating, when the substrate comprises resist. An alternative arrangement is shown in FIG. 2 for vertical or sloping surface patterning whereby a grating 22 has been superimposed onto the CGH pattern 24 to generate +1 and −1 orders. The SLM 8 can take the form of a Liquid Crystal device such as Liquid Crystal on Silicon (LCoS) or a micro-mirror array. These devices offer pixel dimensions in the region of 10-20 μm. If smaller pixels are required the CGH reticle can be fabricated using a fixed pattern using e.g., chrome on glass.

2. When line segments are encoded by the CGH as cylindrical lines, an interesting property of the CGH representation is the relationship between DOF and imaging distance. Since the alias-limited CGH size is dependent on the image distance it is possible to maintain a constant line width for a fixed pixel size. The DOF however may increase as the imaging distance increases, the trade off being a reduction in the gradient of the intensity profile.

Figure 3:
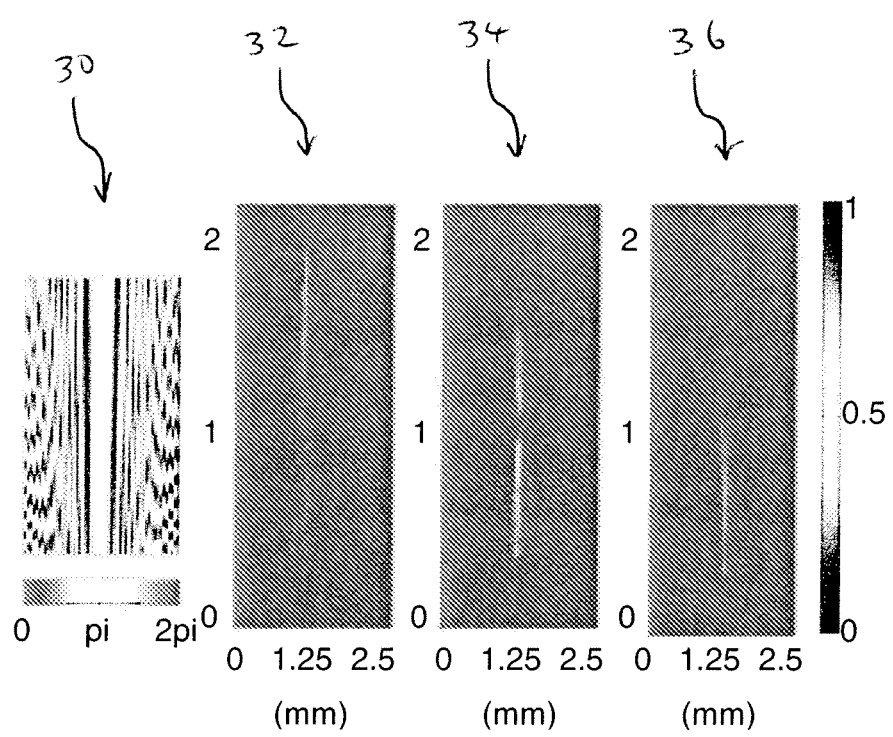
FIG. 3 illustrates a tilted line in space including and idealised phase CGH for a tilted line and simulated image intensities at three mask-substrate separations.

With reference to FIG. 3, an idealised phase CGH for a tilted line 30, results in simulated image intensities at three mask-substrate separations, 32, 34 and 36.

This technique offers increased DOF for certain configurations. For example optically fast lithographic systems have a notoriously small DOF which makes z-axis alignment difficult. The larger DOF afforded by the methods described herein enables a relaxation of z-alignment precision and permits the use of less flat substrates.

A cylinder whose cross section is an ellipse, parabola, or hyperbola is called an elliptic cylinder, parabolic cylinder, or hyperbolic cylinder. Such cylindrical shapes may also be used for the cylindrical lines.

3. This is based on a previous method by Philips but addresses the key limitation regarding depth of field using combined CGH/grating mask. The CGH maintains focusing of the image in the same way as for the co-planar arrangements described above but now in the vertical plane. The CGH can also remove distortions incurred due to the off-axis incidence of the +1 and −1 orders and hence recovering the original pattern.

4. This is about ramification of engineering the DOF of the system to reduce the demands of physical alignment and CGH design. There would still be a need for accurate x-y alignment (as with planar lithography). it would be extremely advantageous if the z offset accuracy could be relaxed and if the image could still projected in the presence of tilt errors. We have effectively capitalised on this property for larger 3d lithography where the local line DOF is quite large. Furthermore, the CGH currently assumes an exact substrate geometry, whereas in fact the actual substrate does not have ideal dimensions but rather is subject to manufacturing tolerances. Although it is possible to design a unique CGH for each object (as described in 1) the preferred arrangement would be a nominal CGH that whose image has sufficient latitude to accommodate substrate variations. DH scanning would then be used to locate larger variations in substrate shape and only adapt the CGH if they are within acceptable tolerances. This is a similar argument with respect to photoresist uniformity where small variations in thickness are compensated by having wider region over z in which the intensity is above a threshold value.

Embodiments of the present invention develop the existing concept of holographic photolithography originally developed for 100 μm-scale devices to sub-μm resolution and address the following aspects of the invention: computation of CGH exposure masks; development of process enhancements to address substrate preparation and exposure requirements; and modelling, design and characterisation of the optical exposure system. The outcome can be assessed by examining the balance achieved between the computation burden, speed and cost of the approach versus the process latitude, quality and yield.

Two fundamental optical configurations are possible: projection exposure using reduction lenses and proximity exposure. The image quality of these systems can be assessed for both spatially coherent (laser) and partially spatially coherent (UV lamp) illumination and with further modification of the system and mask configuration (as described), high density interconnect structures on vertical side-walls can be created.

The purpose of the CGH exposure mask is to control the pattern intensity profile in 3d. To this end, the critical control parameters for successful fabrication are feature shape and intensity control in x, y and z.

For objects comprising one or more tilted planes or tiles the Angular Spectrum (AS) method [Tommasi] and the generalised Rayleigh-Sommerfeld (RS) formulation [Born] for light propagation can be employed in order to encode the pattern into the CGH. These approaches do not require approximations to the the scalar wave equation. Rapid numerical calculation strategies (see for example [Shen]) can be applied. For objects comprising geometrical shapes representable by mathematical functions, the CGH can be defined by a direct optical transform of the input pattern [Rosen]. For object surfaces reducible to neither tiles nor simple shapes the RS method may be used in its most general form. For a given 3d object surface pattern $U(\xi,\eta,z)$, as determined by the DHM R-1000 surface recording, the complex light distribution in the CGH plane $H(x,y,z_0)$ can be computed by the following discrete summation:

$$H(x, y, z_0) = \sum_{\xi}\sum_{\eta}\sum_{z} U(\xi, \eta, z) \frac{e^{jkr}}{2\pi r}\left(\frac{z}{r}\right)\left(\frac{1}{r} - jk\right)\Delta\xi\Delta\eta\Delta z$$

where r is the length of the vector traced between each object point $(\xi,\eta,z)$ and the current CGH pixel location $(x,y,z_0)$ and k is the wave constant.

Where necessary iterative techniques can be used in order to restrict the solution to practical mask coding schemes. Various error reduction methods based on iteration may be suitable such as those applied extensively for adaptive optics [Fineup], beam forming [Eismann] and optical tweezers [Sinclair]. In such cases a minimum error is specified to determine successful image generation or recovery. For lithography only very small errors can be tolerated in the final exposure image in a similar vein to holographic data storage technology [Sanford] but are even more restrictive in the present application. Iteration may be employed to operate directly between the non-planar object and CGH to achieve optimal signal to noise performance.

In addition to these somewhat general approaches the Line Segment (LS) is also applicable for the projection of 3d lines at or below the micron scale. As a consequence of the simplified representations of line patterns used in this method it is difficult to maintain control of line intensity for large depth variations. It is also challenging to achieve registration of fine pitch lines since the method is most amenable to isolated features. Both of these obstacles are addressed by the AS and RS methods. However evidence suggests (FIG. 3) that is scope to exploit the unusual image properties of 3d LS CGHs (in particular the inherent high signal to noise ratio of isolated features) which make them particularly suitable for lithographic patterning. Since the LS method is based on the Fresnel approximation care is need to restrict errors that manifest in projected 3d lines as dimensions reduce below the μm scale.

These algorithms when embodied in custom computer hardware enable the computation of CGH patterns on a time scale consummate with real-time non-planar surface writing when a maskless system is employed. These techniques permit real-time time systems which are limited by exposure demands rather than computational load.

Vertical imaging using a diffraction grating to deflect the mask pattern [Nellissen] suffers from limited focal range due to diffractive line broadening. By the use of a CGH mask combined with an optimised phase grating sloping or vertical focused images are created that are suitable for patterning sloping side walls or vertical side walls that are arranged orthogonal to the CGH plane. By this arrangement distortions typically incurred by projection to the vertical plane are removed by the CGH. Optimised CGH designs can be fabricated as amplitude and phase modulation masks suitable for projection and proximity exposure. By extrapolation of the criterion that the resolution of line segments is approximately equal to the pixel pitch [Maiden] this approach enables the creation of sub-micron features on the substrate. The fabrication of multi-level phase masks, greyscale amplitude and combined phase/amplitude structures offer the possibility of increased image fidelity. Pixelation is especially problematic at extremely close proximity and vector mask representations can be developed to address this.

For the projection case (e.g., FIG. 1) we may use an image reduction factor in the region of 10. This enables the use of comparatively low space-bandwidth SLMs or CGH masks written by laser or e-beam pattern generators. For the proximity case (e.g. FIG. 4) in-house masks with a minimum feature sizes of ~0.5 μm enable the creation of high resolution 3d patterns suitable for applications such as MEMS and 3d chip stacking applications. As the CGH pixel dimension approaches that of the wavelength of illumination it becomes necessary to consider both the approximation inherent within the scalar wave representation [Born] and to draw upon the multitude of possible Resolution Enhancement Techniques (RET) devised originally by the semiconductor fabrication industry for planar imaging [Wong].

A CGH is normally used to store the interference pattern representing objects located at different positions in space. In an embodiment of the present invention the objects are circuit-like features (lines, pads, buses) that are brought to sharp focus at predetermined locations on a 3d surface. They are defined here as idealised objects in a computer, although a physical replica of the object could be used to optically record the interference pattern in a suitable medium (more on this below). In the computer a numerical propagation routine may be used to find the interference pattern. The numerical routine used depends on properties of the physical propagation medium, but this approach generally involves the scalar Helmholz equation with corresponding assumptions of a linear, isotropic and homogeneous medium.

The conventional means for recovering the object image pattern involves illumination with a reference beam which may be on-axis (i.e., normal to the surface of the CGH) or at some angle to the surface of the CGH. This causes an intensity pattern to appear at some distance from the CGH that is matched to the intended object surface. The quality of the reconstruction depends on several factors such as the size and granularity (pixel dimension) of the CGH (i.e. the space-bandwidth) and properties of the illumination used. The critical point is that, provided the reference beam is an exact conjugate replica of reference used in the numerical computation of the CGH, then the object intensity pattern appears in free space with 1:1 scale.

In order to reproduce a scaled-down version of the object intensity pattern, a lens (or a system of lenses) can be placed some distance from the CGH such that the intensity pattern is transmitted through the lens (or lens system) and appears on the opposite side reduced in size by some factor, n. n typically takes a value between 4 and 10 in photolithography applications.

When this procedure is carried out without any alteration to the CGH, a distorted scaled copy of the intensity pattern will appear due to the basic properties of refractive imaging. This commonly manifests '3d perspective' errors in the form of scaling of both the transverse (x,y) dimensions and axial dimensions, making the object appear distorted. The degree of distortion is related to the geometrical arrangement between the lens and the object pattern created by the CGH.

The approach taken by embodiments of the present invention is based on the realisation that pre-distortions may be applied to the object stored in the computer such that its CGH produces an appropriately distorted 3d image. When the modified image is passed through a lens (system), the corrected pattern appears. This approach affords great freedom to accommodate different system configurations (different arrangements of radiation source, wave front modulator, projection system and substrate) since the object is stored as a CGH and can thus is readily modified.

The CGH is adjusted such that the axial scaling of features of the object pattern are adjusted according to the projection arrangement. Transverse (x-y) features are scaled by a factor according to their location along the optical axis. The overall object is also scaled along the axial direction by a different factor. This adjustment takes the general form of a spatial transform which is a function of the system parameters (lens system properties such as focal lengths, numerical aperture, proximity between CGH image and lens, and reduction factor n) and the object pattern location.

An equivalent optically generated hologram may be recorded by a. constructing a correctly scaled object (made smaller by the factor n), b. placing it in front of the projection lens (system), c. illuminating said object with the desired pattern in a suitable fashion to create an object wave front which passes though the lens (system) (this step would itself be difficult without some kind of 3d imaging system to create the pattern on the object surface), d. transforming said wave front into an interference intensity pattern using a second reference wave front and e. recording the intensity pattern in a suitable photosensitive medium. This method would be very cumbersome and inconvenient to handle many different object shapes and patterns.

These adjustments may then be appropriately encoded into the CGH and constrained in the same manner as the non-projected case. To do this a set of parameters pertaining to limitations imposed by the wave front modulator are applied to the CGH solution. Parameters may include modulator pixel size, modulation mode (phase or amplitude) and number of quantised levels. A non-distorted image will result when the proper adjustments have been made to the object and 'encoded' by the CGH for correct display by the wave front modulator.

Figure 4:
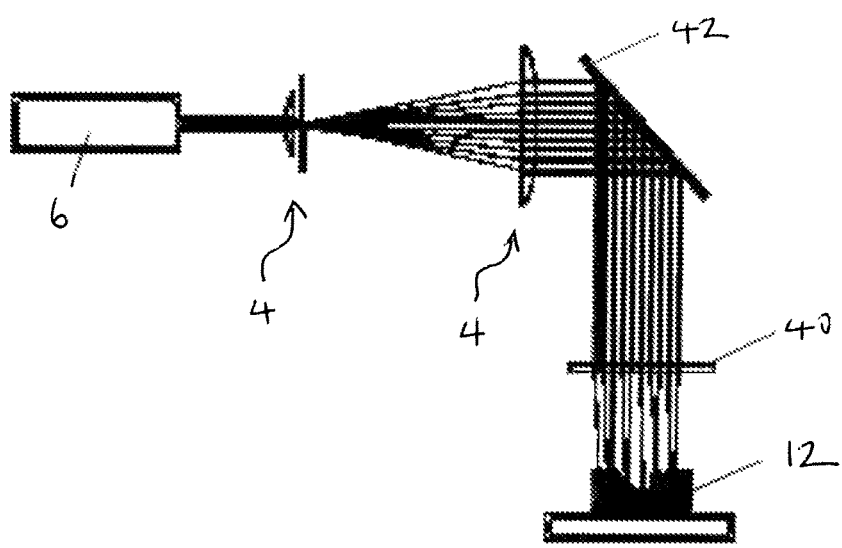
FIG. 4 illustrates proximity lithography with a holographic mask.

With reference to FIG. 4 a conventional fixed CGH mask 40 could also be used in place of a wave front modulator using essentially the same procedure, as indicated by the elements laser/lamp 6, illumination optics 4 and substrate 12 in common with FIG. 1 and with a mirror 42 replacing the optical element 7.

A digital holographic (DH) microscope (8 in FIG. 1) may be used to determine the precise substrate shape prior to imaging. The measured shape may be used to generate the optimised CGH for that substrate, which can then be projected via an SLM.

Features encoded into the CGH can be added in order to assist with mask-to-substrate alignment. These can for example take the form of Fresnel zone plates that locate onto fiducial marks on the substrate and can be designed for illumination with red light in order that the photoresist is not affected during the alignment procedure. An expanded laser beam can be used to illuminate the CGH which gives highly coherent illumination, but in order to get a sufficiently flat intensity distribution the central portion of the beam can be used, thus wasting most of the beam power and leading to longer exposure times. Diffractive and refractive beam reshapers may be employed to generate a near top-hat intensity profile and hence improve efficiency. Diffractive reshapers are easier to integrate within the optical system but exhibit particular effects on the resulting image due to the phase distortions that they induce.

Deep sub-micron planar lithography makes great use of partial coherence control and off-axis illumination to enhance process latitude [Wong]. There are considerable advances to be made by applying these to the patterning of 3d substrates, but attempts to do this are not known. Reduced spatial coherence introduces a controllable speckle reduction, permitting a degree of spatial localisation of the CGH. This affords a corresponding localisation in the calculation of the CGH hence a reduction of the memory (RAM) needed for computation. A wavelength-filtered mercury arc lamp source (standard mask aligner light source) together with bespoke optics provides a suitable light source for this purpose.

Projecting holographic images using coherent UV illumination and both DMD and LCoS devices, including the use of scanning techniques [Clube] is distinct from traditional incoherent visible light applications in that the device response and damage threshold tolerance is different in the coherent UV regime, causing degradation of the maximal birefringence of the device at high power densities [Remenyi]. Maskless holographic lithography, particularly in projection configuration, creates an efficient utilisation of the relatively coarse pixels arrays found in typical DMD (~13.5 μm) and LCD (~8 μm) arrays and hence enables sub-micron patterning by step and repeat or multiple exposure procedures.

To date 3d lithography research has concentrated on feature sizes of the order of 10 μm using photoresist with a thickness of 3-10 μm. The definition of sub-micron features may require a corresponding reduction in photoresist thickness. This precludes the use of standard electrophoretic photoresist formulations, since these have a minimum thickness of ~3 μm. However, the thickness can be reduced into the sub-micron realm by suitable process modification and addition of extra components to the negative- and positive-acting formulations. These components are known to be highly volatile, so process control is an important factor in achieving reproducible results. The resist thickness must remain near-uniform even after the preliminary soft-bake step, so careful optimisation is needed to control the process.

The patterning of 60 μm-pitch tracks over 300 μm steps has been demonstrated using spray-on resist [Fischer], with the authors noting that the minimum line width was governed by diffractive line broadening which can be directly alleviated by embodiments of the present invention.

The substrates may be manufactured by anisotropic etching of suitable orientated silicon wafers to generate sloping and vertical surfaces. This is the standard method used in MEMS and MOEMS applications. More complex substrate shapes may be created using machinable glass-ceramics.

Embodiments of the present invention address the difficulty of fabricating MEMS devices and chip to chip packaging.

By way of example, TSVs (Through-Silicon Vias) can be created on anisotropically-etched silicon wafer. With a pitch of 2 μm a single 2×2 mm square hole could potentially carry 2,600 tracks. This is equivalent to a vertical routing density of 650 vias/mm2. A 10 μm TSV pitch would be required to achieve the same routing density, but in this case electroplating considerations mean that the wafer must be thinned in order to keep the aspect ratio of the hole low. At this pitch there would be no room for active circuitry, as is obviously also the case with a single large hole. Embodiments of the present invention may work with non-thinned wafers and also eliminate the need for a custom laser drilling step, since the large holes are made using a standard wet chemistry etching process.

TSVs carry a single electrical connection. However the patterning of multiple connections down a single vertical hole can be achieved by combining a CGH with a diffraction grating as described in accordance with an embodiment of the present invention. For example, a 1 mm diameter vertical-walled hole and a track pitch of 2 μm equates to a track density of ~400 tracks/mm2. The same scheme may be applicable for patterning tracks in rectangular slots or on the straight edges of diced chips. Once again, this routing density is achieved in full-thickness wafers. Using the same CGH/diffraction grating combination the patterning of non-vertical features onto vertical side walls is equally possible. This could include, for instance, the patterning of a helical micro inductor.

Many microsystems contain curved surfaces over which it is required to pattern electrical or diffractive structures. For instance, fly's eye type cameras and sensors, microfluidic electrode arrays and gratings on curved lenses.

Passive elements such as capacitors and inductors can now be created as 3d volume elements instead of planar components. For example a MEMS device etched to create a hole some 400 μm in diameter could be patterned according to embodiments of the present invention to create a spiral descending track into the hole giving a solenoidal inductor.

In addition capacitor plates can be created according to embodiments of the present invention on sloping surfaces where the area of overlap between them may be affected by vibration or thermal expansion or other physical generating effects and so produce an electrical method of measuring the physical change.

Further modifications and improvements may be added without departing from the scope of the invention described in the claims.

References

S. Bühling, F. Wyrowski, E-B. Kley, A. J. M. Nellisen, L. Wang and M. Dirkzwager, 'Resolution enhanced proximity printing by phase and amplitude modulating masks', J. Micromech. Microeng. 11 603-611 (2001).

L. G. Neto, P. S. P. Cardona, G. A. Cirino, R. D. Mansano and P. Verdonck, 'Design, fabrication and characterization of a full complex-amplitude modulation diffractive optical element' SPIE J. Micro/Nanolithography, MEMS and MOEMS 2 96-104 (2003).

Y. Borodovsky, W-H. Cheng, R. Schenker and V. Singh, Pixelated phase masks as novel lithography RET', Proc. SPIE 6924 69240E (2008).

T. Nellisen, M. Botermans, M. Burghoorn, J. van Delft, E, van Grunsven, J. Scheer and M. de Samber, 'A novel photolithographic method for realizing 3-d interconnection patterns on electronic modules', 14th IMAPS European Microelectronics and Packaging Conference & Exhibition, Prague, Czech Republic (2004).

C. Frére, D. Leseberg and O. Bryngdahl, 'Computer-generated holograms of three-dimensional objects composed of line segments', J. Opt. Soc. Am. 3(5) 726-730 (1986).

K. Fischer and R. Suss, 'Spray coating—a solution for resist film deposition across severe topography', IEEE EMT Symposium 338-341 (2004).

T. Tomassi and B Bianco, Computer-generated holograms of tilted planes by a spatial frequency approach', J. Opt. Soc. Am. A 10(2), 200-305 (1993).

M. Born and E. Wolf *Principles of Optics, 6$^{th}$ Ed.*, Pergamon Press, Oxford (1980).

J. R. Fienup, 'Phase retrieval algorithms: a comparison', Appl. Opt. 21(15), 2758-2769 (1982).

M. T. Eismann, A. M. Tai and J. N. Cederquist, 'Iterative design of a holographic beamformer', Appl. Opt. 28(13), 2641-2650 (1989).

G. Sinclair, J. Leach, P. Jordan, G. Gibson, E. Yao, Z. J. Laczik, M. J. Padgett and J. Courtail, 'Interactive application in holographic optical tweezers of a multiple-plane Gerchberg-Saxton algorithm for three-dimensional light shaping', Opt. Express 12(8), 1665-1670 (2004).

J. L. Sanford, P. F. Greier, K. H. Yang, M/Lu, R. S. Olyha, C. Narayan, P. Alt and R. Melcher, 'A one-megapixel spatial light system for holographic data storage', IBM J. R&D 42 (3-4) 411-426 (1998).

F. Shen and A. Wang, Fast-Fourier-transform based numerical integration method for the Rayleigh-Sommerfeld diffraction formula', Appl. Opt. 45(6), 1102-1110 (2006).

F. Clube, S. Gray, D. Struchen, S. Malfoy, Y. Darbellay, N. Magnon, B. Le Gratiet and J-C. Tisserand, 'Large-field, high-resolution photolithography', Proc. SPIE 3099, 36-45 (1997).

A. K-K. Wong *Resolution Enhancement Techniques in optical lithography*, SPIE press, WA (2001).

A. Maiden, R. P. McWilliam, A. Purvis, S. Johnson, G. L. Williams, N. L. Seed and P. A. Ivey, "Non-planar photolithography with computer generated holograms," Optics Letters 30(11) 1300-1302 (2005).

J. Reményi, P. Várhegyi, L. Domján, P. Koppa and E. Lõrincz "Amplitude, phase, and hybrid ternary modulation modes of a twisted-nematic liquid-crystal display at ~400 nm", Appl. Opt. 42(17), 3428-3434 (2003).

J. Rosen, 'Computer-generated holograms of images reconstructed on curved surfaces', Appl. Opt. 38(29), 6136-6140 (1999).

T. Poon, B. Lee, H. Yoshikawa, and W. Osten, "Digital holography and 3D imaging: introduction to the feature issue," Appl. Opt. 47(19), (2008).

A. Maiden, R. P. McWilliam, A. Purvis, S. Johnson, G. L. Williams, N. L. Seed and P. A. Ivey, "Non-planar photolithography with computer generated holograms," Optics Letters 30(11) 1300-1302 (2005).

The invention claimed is:

1. An exposure apparatus for projecting radiation corresponding to a pattern onto a substrate, the exposure apparatus comprising:
a wave front controller comprising a phase grating and a computer generated hologram pattern combined to alter a wave front of the radiation and to transform a focal plane of an altered wave front for projection onto a vertical or sloping side wall of the substrate.

2. An exposure apparatus according to claim 1, wherein the configuration means is operable to configure the wave front control means using Fresnel patterns to provide an extended depth of field of the projected altered wave front.

3. An exposure apparatus according to claim 1, wherein the configuration means is operable to configure the wave front control means by encoding line segments of the pattern as cylindrical lines.

4. An exposure apparatus according to claim 1, wherein the phase grating is curved to transform the focal plane of the altered wave front for projection on to the inside of a curved hole of the substrate.

5. An exposure apparatus according to claim 1, further comprising a radiation source for providing the wave front controller with partially coherent radiation to be altered.

6. An exposure apparatus according to claim 1, further comprising a substrate profilimeter for determining a topography of the substrate.

7. An exposure apparatus according to claim 6, wherein the substrate profilimeter comprises a digital holography inspection apparatus.

8. An exposure apparatus according to claim 1, comprising a configurator for configuring the wave front controller based on the pattern and a topography of the substrate.

9. An exposure apparatus according to claim 8, wherein the configurator is operable to configure the wave front controller by calculating inverse propagation between non-planar topography of the substrate and the wave front controller.

10. An exposure apparatus according to claim 9, wherein the configurator is operable to calculate the inverse propagation using a Rayleigh-Sommerfeld diffraction formula.

11. An exposure apparatus according to claim 9, wherein the configurator is operable to calculate the inverse propagation using iteration to determine a restricted encoding in a configuration of the wave front controller.

12. An exposure apparatus according to claim 1, comprising a projection lens assembly for projecting the altered wave front onto a substrate.

13. A method of projecting radiation corresponding to a pattern onto a substrate, the method comprising:
altering a wave front of the radiation by using a wave front controller comprising a phase grating and a computer generated hologram pattern combined to transform a focal plane of an altered wave front for projection onto a vertical or sloping side wall of the substrate.

14. A method according to claim 13, wherein the step of configuring uses Fresnel patterns to provide an extended depth of field of the projected altered wave front.

15. A method according to claim 13, wherein the step of configuring comprises encoding line segments of the pattern as cylindrical lines.

16. A method according to claim 13, wherein the phase grating is curved to transform the focal plane of the altered wave front for projection on to the inside of a curved hole of the substrate.

17. A method according to claim 13, further comprising the step of providing partially coherent radiation to be altered.

18. A method according to claim 13, comprising configuring the altering based on the pattern and a topography of the substrate.

19. A method according to claim 18, wherein the step of configuring comprises calculating inverse propagation between non-planar topography of the substrate and the wave front controller used to perform the step of altering.

20. A method according to claim 19, wherein the step of calculating the inverse propagation comprises using a Rayleigh Sommerfeld diffraction formula.

21. A method according to claim 19, wherein the step of calculating the inverse propagation comprises using iteration to determine a restricted encoding in the step of configuring.

22. A method according to claim 18, further comprising the step of determining the topography of the substrate.

23. A method according to claim 22, wherein the step of determining the topography of the substrate comprises using digital holography inspection.

24. A method according to claim 13, comprising projecting the altered wave front onto a substrate.

25. A reticle for use in projecting radiation corresponding to a pattern onto a substrate, the reticle comprising a wave front controller comprising a phase grating and a computer generated hologram pattern combined to alter a wave front of the radiation and to transform a focal plane of an altered wave front for projection onto a vertical or sloping side wall of the substrate.

* * * * *